(12) United States Patent
Otremba

(10) Patent No.: US 12,068,226 B2
(45) Date of Patent: Aug. 20, 2024

(54) SEMICONDUCTOR ASSEMBLY WITH MULTI-DEVICE COOLING

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 318 days.

(21) Appl. No.: 17/473,423

(22) Filed: Sep. 13, 2021

(65) Prior Publication Data

US 2023/0079413 A1 Mar. 16, 2023

(51) Int. Cl.
*H01L 23/473* (2006.01)
*H01L 25/07* (2006.01)

(52) U.S. Cl.
CPC .......... *H01L 23/473* (2013.01); *H01L 25/072* (2013.01)

(58) Field of Classification Search
CPC ............................ H01L 23/473; H01L 25/072
See application file for complete search history.

(56) References Cited

U.S. PATENT DOCUMENTS

| | | | |
|---|---|---|---|
| 9,812,373 B2 | 11/2017 | Fachmann et al. | |
| 10,149,413 B1 * | 12/2018 | Dede | H05K 7/20927 |
| 10,566,260 B2 | 2/2020 | Otremba et al. | |
| 10,755,999 B2 | 8/2020 | Otremba et al. | |
| 10,886,186 B2 | 1/2021 | Scharf et al. | |
| 2007/0290311 A1 * | 12/2007 | Hauenstein | H01L 23/3735 257/E23.098 |
| 2018/0211900 A1 * | 7/2018 | Gutala | G11C 7/04 |
| 2020/0006187 A1 * | 1/2020 | Otremba | H01L 23/3675 |
| 2020/0328139 A1 * | 10/2020 | Chiu | H01L 25/0657 |
| 2021/0318734 A1 * | 10/2021 | Hoffmeyer | H01L 23/373 |

FOREIGN PATENT DOCUMENTS

| | | |
|---|---|---|
| DE | 102014118080 A1 | 6/2016 |
| DE | 102017120747 A1 | 3/2019 |
| DE | 102018107094 A1 | 9/2019 |
| DE | 102018204764 A1 | 10/2019 |
| DE | 102018115509 A1 | 1/2020 |

OTHER PUBLICATIONS

Grassmann, Andreas, "Power Module with Semiconductor Packages Mounted on Metal Frame", U.S. Appl. No. 17/385,596, filed Jul. 26, 2021, 1-50.

* cited by examiner

*Primary Examiner* — Tucker J Wright
(74) *Attorney, Agent, or Firm* — Murphy, Bilak & Homiller, PLLC

(57) ABSTRACT

A semiconductor device assembly includes a cooling system, a plurality of semiconductor packages, each including a semiconductor die and an encapsulant body, and a multi-device thermal interface interposed between the plurality of semiconductor packages and the cooling system, wherein the semiconductor packages are each configured as surface mount devices, and wherein the multi-device thermal interface thermally couples each of the semiconductor packages to the cooling system.

18 Claims, 13 Drawing Sheets

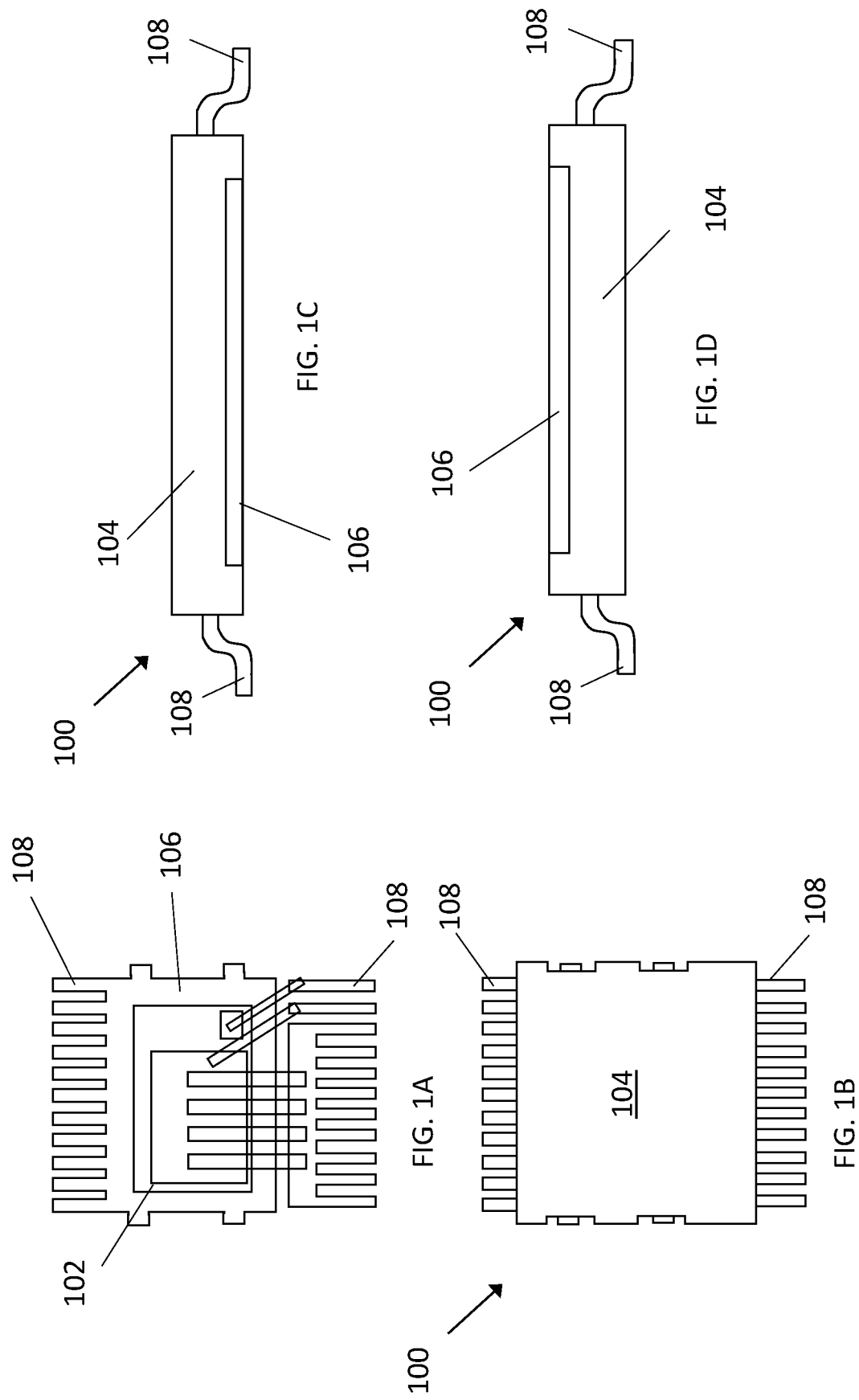

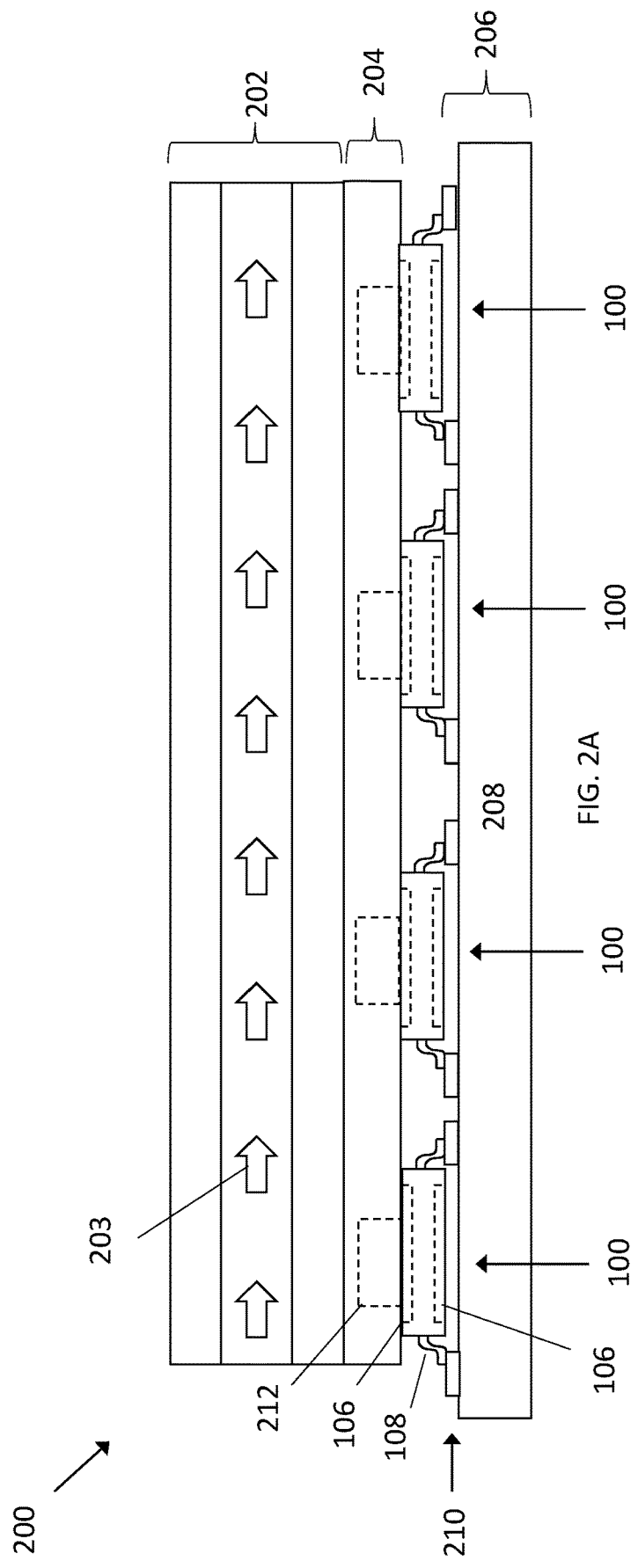

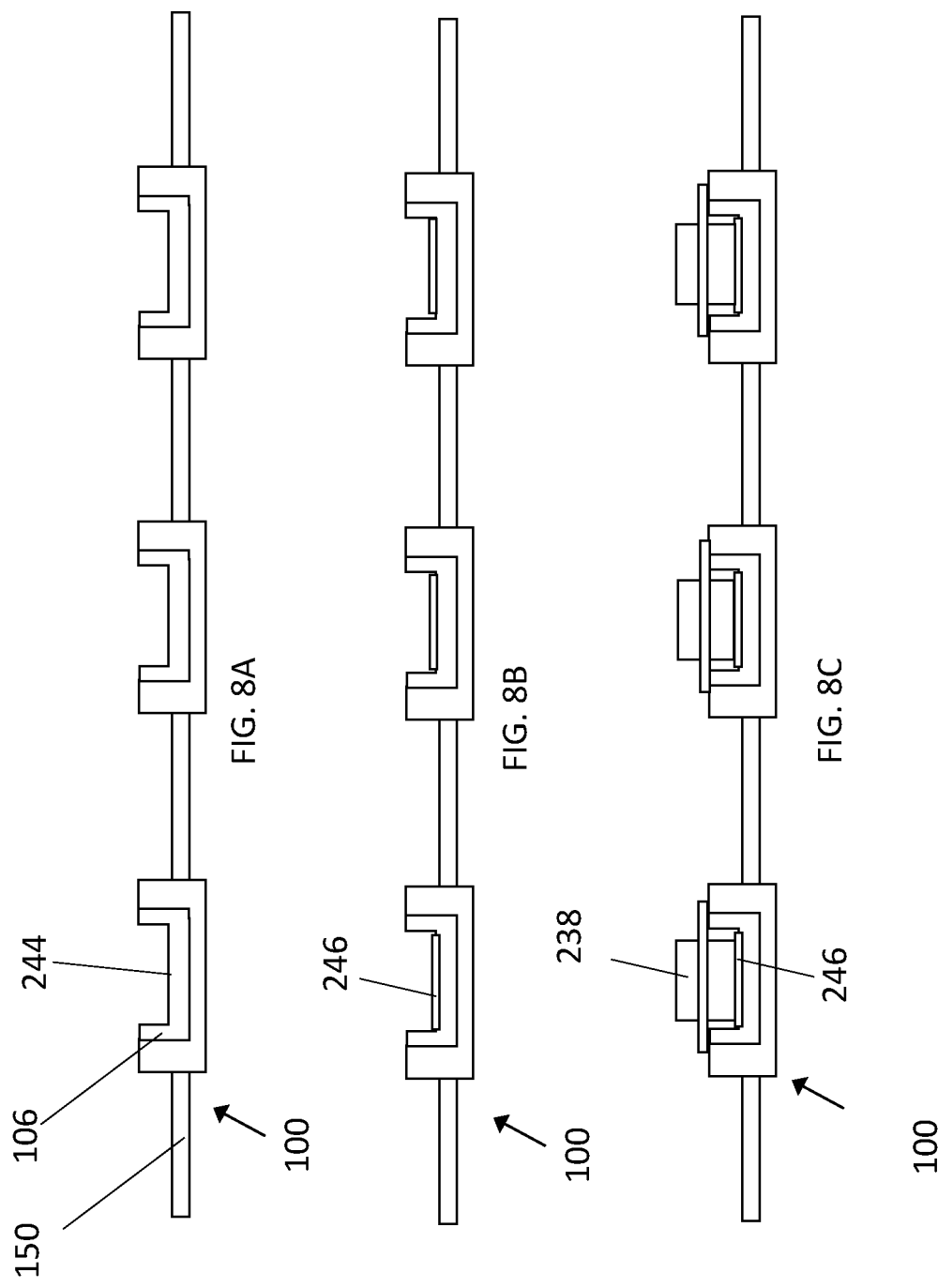

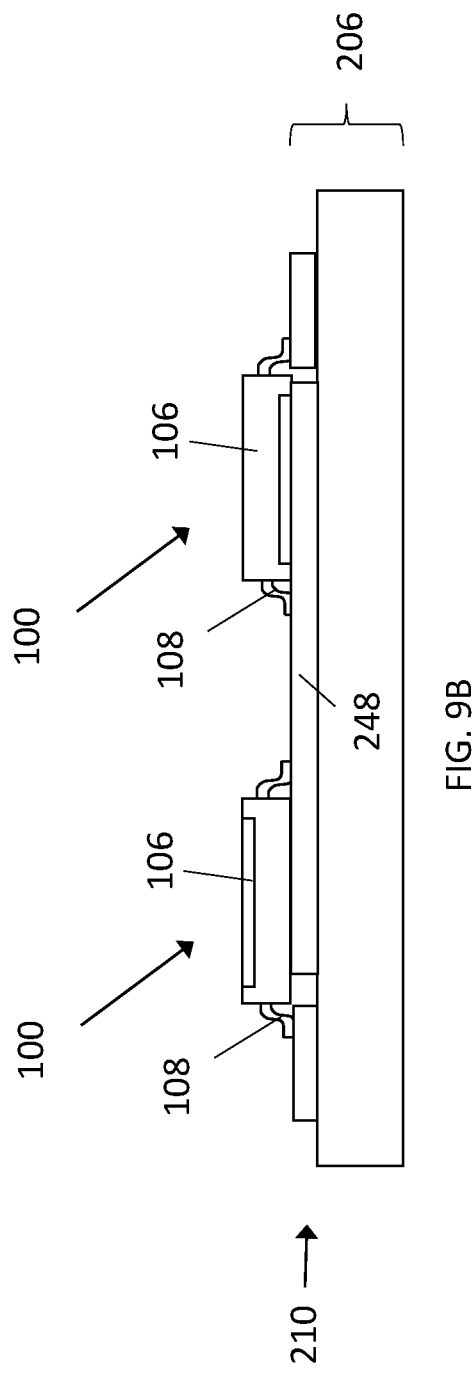

SEMICONDUCTOR ASSEMBLY WITH MULTI-DEVICE COOLING

BACKGROUND

Many applications such as automotive and industrial applications utilize power devices such as IGBTs (insulated gate bipolar transistors), power MOSFETs (metal oxide semiconductor field effect transistors), power diodes, etc. These devices may be used in power converter circuits such as single and multi-phase half-wave rectifiers, single and multi-phase full-wave rectifiers, voltage regulators, etc. Power electronics applications often use IPMs (integrated power modules) to accommodate and protect multiple power devices and provide thermal cooling of the devices. However, due to the substrate materials of IPMs and custom tooling needed to create the plastic housing of IPMs, these products are cost-prohibitive or not desirable in certain applications. Accordingly, there is a need for a multi-device power electronics assembly with good thermal performance and low cost.

SUMMARY

A semiconductor device assembly is disclosed. According to an embodiment, the semiconductor device assembly comprises a cooling system, a plurality of semiconductor packages, each comprising a semiconductor die and an encapsulant body, and a multi-device thermal interface interposed between the plurality of semiconductor packages and the cooling system, wherein the semiconductor packages are each configured as surface mount devices, and wherein the multi-device thermal interface thermally couples each of the semiconductor packages to the cooling system.

Separately or on combination, the cooling system comprises a fluid and is configured to actuate the fluid across the plurality of semiconductor packages.

Separately or on combination, the semiconductor packages are each configured as power devices.

Separately or on combination, the semiconductor packages are each configured as discrete MOSFETs or discrete IGBTs.

Separately or on combination, at least one of the semiconductor packages comprises two or more transistor dies connected in parallel with one another.

Separately or on combination, at least one of the semiconductor packages is configured as a power converter.

Separately or on combination, the semiconductor device further comprises a carrier comprising an electrically insulating region and a first structured metallization layer disposed on the electrically insulating region, and wherein the plurality of semiconductor packages is mounted on the carrier.

Separately or on combination, the semiconductor packages each comprise leads that extend out from outer edge sides of the encapsulant body, and wherein the plurality of semiconductor packages is mounted on the carrier such that the leads of each of the semiconductor packages are affixed and electrically connected to the first structured metallization layer.

Separately or on combination, the semiconductor packages each comprise a die pad that is exposed from the encapsulant body, and wherein the die pad of each of the semiconductor packages is thermally coupled to the cooling system via the multi-device thermal interface.

Separately or on combination, the die pad of each of the semiconductor packages faces away from the carrier.

Separately or on combination, the carrier is a printed circuit board.

Separately or on combination, the carrier is a power electronics substrate.

Separately or on combination, the carrier is disposed below the plurality of semiconductor packages, and wherein the multi-device thermal interface and the cooling system are disposed above the carrier.

Separately or on combination, the semiconductor packages each comprise a die pad that is exposed from the encapsulant body, and wherein the die pad of each of the semiconductor packages is thermally coupled to the cooling system via the multi-device thermal interface.

Separately or on combination, at least some of the semiconductor packages comprise a thermally conductive structure that is attached to the die pad and thermally couples the die pad of the respective semiconductor package to the multi-device thermal interface.

Separately or on combination, the multi-device thermal interface comprises gap filler material.

Separately or on combination, the multi-device thermal interface comprises thermal interface material.

Separately or on combination, the multi-device thermal interface comprises a layer of thermal interface material and a gap filler material disposed between the semiconductor packages and the layer of thermal interface material.

Separately or on combination, the multi-device thermal interface comprises metal.

Separately or on combination, multi-device thermal interface is configured to electrically isolate each of the semiconductor packages from the cooling system.

According to another embodiment, the semiconductor device assembly comprises a cooling system, a multi-device thermal interface arranged on the cooling system, a plurality of semiconductor packages mounted on the multi-device thermal interface, wherein the semiconductor packages are each configured as surface mount devices, and wherein the multi-device thermal interface thermally couples each of the semiconductor packages to the cooling system.

Separately or on combination, the multi-device thermal interface comprises a layer of thermally conductive material that is flush against a surface of the cooling system.

Separately or on combination, the multi-device thermal interface comprises a printed circuit board, wherein the printed circuit board comprises a laminate layer and a first structured metallization layer disposed on the laminate layer.

Separately or on combination, the printed circuit board comprises a second metallization layer, wherein the first structured metallization layer and the second metallization layer are disposed on opposite sides of the laminate layer, and wherein the second metallization layer is flush against a surface of the cooling system.

Separately or on combination, the semiconductor packages each comprise an encapsulant body and leads that extend out from outer edge sides of the encapsulant body, and wherein the semiconductor packages are mounted on the carrier such that the leads of each of the semiconductor packages are affixed and electrically connected to the first structured metallization layer.

Separately or on combination, the semiconductor packages each comprise a die pad that is exposed from the encapsulant body.

Separately or on combination, the semiconductor packages are arranged such that the die pad faces away from the cooling system, and wherein the semiconductor device assembly further comprises a plurality of metal heat sink elements that are separately mounted to the die pad of each of the semiconductor packages.

Separately or on combination, the semiconductor packages are arranged such that the die pad faces the cooling system, and wherein the die pad of each of the semiconductor packages is thermally coupled to the cooling system by the multi-device thermal interface.

Separately or on combination, wherein the printed circuit board comprises depressions formed in the laminate layer, and wherein the semiconductor packages are mounted such that the encapsulant body of the semiconductor packages extend into the depressions.

Separately or on combination, the semiconductor device assembly further comprises a layer of thermal interface material that is flush against a surface of the cooling system, wherein the printed circuit board comprises openings that extend through the laminate layer and the first structured metallization layer, and wherein each of the semiconductor packages are mounted on the layer of thermal interface material.

According to another embodiment, the semiconductor device assembly comprises a circuit carrier, a plurality of semiconductor packages mounted on the circuit carrier, a cooling system extending over each one of the semiconductor packages, and wherein the semiconductor packages are each configured as surface mount devices, wherein the multi-device thermal interface thermally couples each of the semiconductor packages to the cooling system, and wherein the multi-device thermal interface comprises a layer of thermal interface material that is flush against a surface of the cooling system and a gap filler material that is arranged between the semiconductor packages and the layer of thermal interface material.

Separately or in combination, the circuit carrier comprises a first structured metallization layer, wherein the semiconductor packages each comprise an encapsulant body and leads that extend out from outer edge sides of the encapsulant body, and wherein the semiconductor packages are mounted on the carrier such that the leads of each of the semiconductor packages are affixed and electrically connected to the first structured metallization layer.

Separately or in combination, a package height of a first one the semiconductor packages is less than a package height of a second one the semiconductor packages, the package heights of the first and second semiconductor packages being a distance between contacting surfaces of the leads and an upper side of the encapsulant body.

Separately or in combination, the second one of the semiconductor packages comprises a die pad with an outer surface that is substantially coplanar with the upper side of the encapsulant body, and a die pad extension that is attached and thermally coupled the to the outer surface of the die pad.

Separately or in combination, a height of the second one of the semiconductor packages between the contacting surfaces of the leads and an upper surface of the die pad extension is substantially close to the package height of the first one the semiconductor packages.

According to another embodiment, the semiconductor device assembly comprises a circuit carrier, a plurality of semiconductor packages mounted on the circuit carrier, and a cooling system extending over each one of the semiconductor packages, wherein the semiconductor packages are each configured as surface mount devices, wherein the multi-device thermal interface thermally couples each of the semiconductor packages to the cooling system, and wherein the multi-device thermal interface comprises a metal bridge that is thermally coupled to each of the semiconductor packages.

Separately or in combination, the multi-device thermal interface comprises a layer of thermal interface material that is flush against a surface of the cooling system, and wherein the metal bridge structure is electrically isolated from the cooling system by the layer of thermal interface material.

Separately or in combination, the metal bridge is affixed to the cooling system by a plurality of fasteners, and wherein the circuit carrier comprises a plurality of openings that are each aligned with the plurality of fasteners.

Separately or in combination, the semiconductor packages each comprise an encapsulant body and a die pad that is exposed from the encapsulant body, and wherein the die pads of each of the semiconductor packages are facing and thermally coupled to the metal bridge.

According to another embodiment, the semiconductor device assembly comprises a circuit carrier, a plurality of semiconductor packages mounted on the circuit carrier, a cooling system extending over each one of the semiconductor packages, and a gap filler material that is arranged between the plurality of semiconductor packages and the cooling system, wherein the semiconductor packages are each configured as surface mount devices, and wherein each of the semiconductor packages comprise electrical isolation structures that electrically isolate the semiconductor packages from the cooling system.

Separately or in combination, the semiconductor packages each comprise an encapsulant body and a die pad that is exposed at an upper surface of the encapsulant body that faces the cooling system, and wherein the electrical isolation structures are disposed between the die pads of the semiconductor packages and the cooling system.

Separately or in combination, the die pad of each of the semiconductor packages comprises a depressed receptacle that extends below the upper surface of the encapsulant body, and wherein the electrical isolation structures are disposed within the depressed receptacle.

Separately or in combination, the electrical isolation structures comprise discrete segments of a power electronics substrate, and wherein the discrete segments are affixed to the die pad of the semiconductor packages by an adhesive.

According to another embodiment, the semiconductor device assembly comprises a power electronics substrate, a plurality of semiconductor packages mounted on the power electronics substrate, and a cooling system extending over each one of the semiconductor packages, wherein the semiconductor packages are each configured as surface mount devices, wherein the semiconductor packages each comprise an encapsulant body and a die pad that is exposed from the encapsulant body, wherein the die pad of a first one of the semiconductor packages faces and is thermally coupled to the cooling system, and wherein the die pad of a second one of the semiconductor packages faces and is thermally coupled to the power electronics substrate.

Separately or in combination, the semiconductor device assembly further comprises a multi-device thermal interface between the plurality of semiconductor packages and the cooling system, wherein the multi-device thermal interface thermally couples the first one of the semiconductor packages to the cooling system.

Separately or in combination, the multi-device thermal interface comprises an electrical isolation foil and a gap filler material that is arranged between the semiconductor packages and the electrical isolation foil.

Separately or in combination, the power electronics substrate is arranged on and thermally coupled to a second cooling system.

Separately or in combination, the power electronics substrate comprises a DBC substrate or an IMS substrate.

Separately or in combination, the power electronics substrate comprises a first structured metallization layer, and wherein the die pad of the second one of the semiconductor packages faces and is thermally coupled to a first contact pad formed in the first structured metallization layer.

Separately or in combination, the first one of the semiconductor packages is partially disposed on the first contact pad, and wherein a first one or group of leads from the first one of the semiconductor packages is electrically connected to the first contact pad.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A-1D, illustrates a semiconductor package, according to an embodiment. FIG. 1A depicts a plan-view of the semiconductor package without the encapsulant body, FIG. 1B depicts a plan-view of the semiconductor package with the encapsulant body, FIG. 1C schematically depicts a side-view of the semiconductor package with a bottom-side cooling configuration, and FIG. 1D schematically depicts a side-view of the semiconductor package with a top-side cooling configuration.

FIG. 2, which includes FIGS. 2A-2B, illustrates a semiconductor device assembly with a plurality of semiconductor packages thermally coupled to a cooling system by a multi-device thermal interface, according to an embodiment. FIG. 2A illustrates an assembly with the multi-device thermal interface and the cooling system disposed above the semiconductor packages, and FIG. 2B illustrates an assembly with the multi-device thermal interface and the cooling system disposed below the semiconductor packages.

FIG. 3, which includes FIG. 3A illustrates an assembly wherein separate heat sink structures are attached to the die pads of the semiconductor packages; FIG. 3B illustrates an assembly wherein the die pads of the semiconductor packages face and are thermally coupled to the cooling system; and FIG. 3C illustrates an assembly wherein the die pads of the semiconductor packages face and are thermally coupled to the cooling system.

FIGS. 5A-5C, illustrates selected steps for attaching a die pad extension to a semiconductor package, according to an embodiment. FIG. 5A illustrates the semiconductor packages after encapsulation and before lead trimming; FIG. 5B illustrates attachment of the die pad extension to the die pads; and 5C illustrates forming a plating layer on the outside of the semiconductor packages.

FIG. 8, which includes FIGS. 8A-8C, illustrates selected steps for attaching a die pad extension to a semiconductor package, according to an embodiment. FIG. 8A illustrates forming a depressed receptacle in the die pads of the semiconductor packages; FIG. 8B illustrates forming an adhesive in the depressed receptacle of the die pads; and 8C illustrates forming attachment of a segment of a power module to the die pads.

FIG. 9, which includes FIGS. 9A-9B, illustrates a semiconductor device assembly with a plurality of semiconductor packages thermally coupled to a cooling system by a multi-device thermal interface, according to an embodiment. FIG. 9A illustrates an assembly with a cooling structure on both sides of the semiconductor packages; and FIG. 9B illustrates a close up view of a mounting arrangement of two semiconductor packages.

DETAILED DESCRIPTION

Figure 2B:
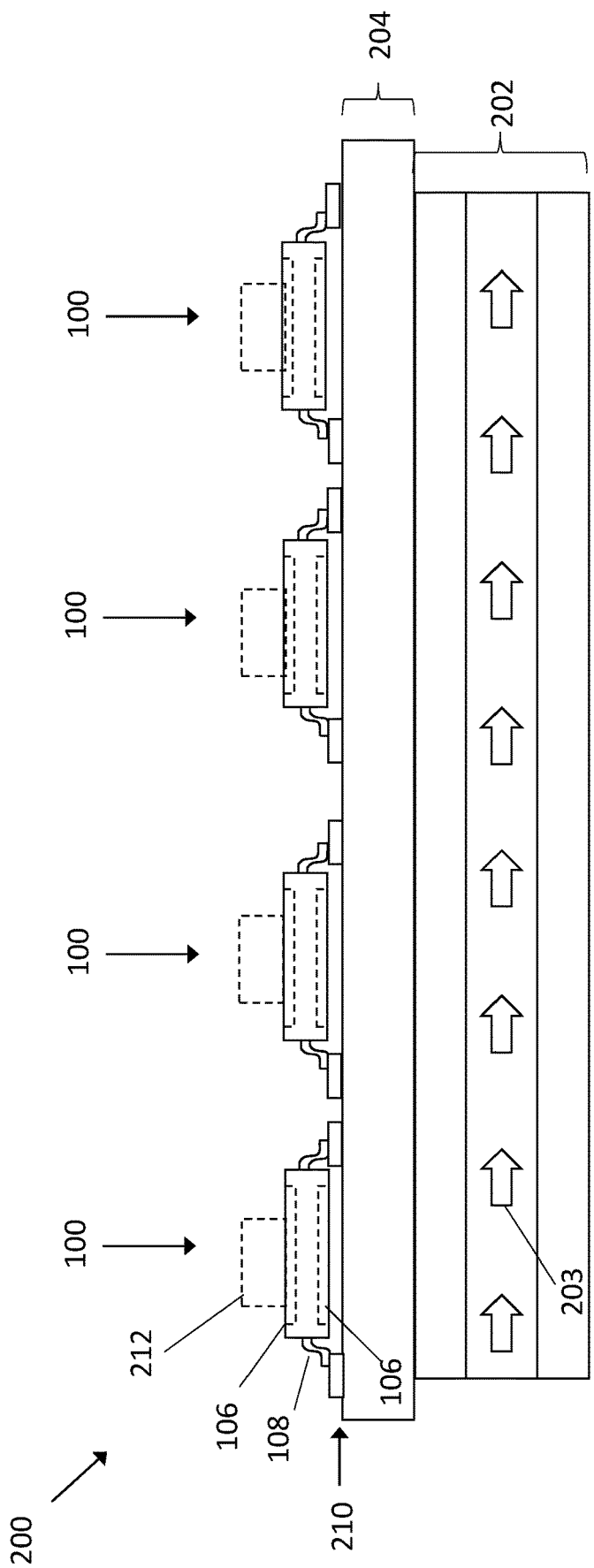

Embodiments of a semiconductor device assembly that comprises a plurality of semiconductor packages mounted together and thermally coupled to a cooling system are disclosed herein. The semiconductor packages can be mounted on a carrier structure, such as a PCB, that provides electrical interconnect. Each of the semiconductor packages are thermally coupled to the cooling system by a multi-device thermal interface. The cooling system may be an air-based or fluid-based cooling system that is able to extract significant quantities of heat from the semiconductor packages. The multi-device thermal interface is a thermally conductive and (optionally) electrically isolating structure that is thermally coupled to the semiconductor packages. This arrangement allows for the integration of multiple semiconductor devices together in a single unit, with the multi-device thermal interface and the cooling system providing the necessary thermal characteristics for power applications. Moreover, the arrangement can be constructed at substantially less cost than IPMs that include a power electronics substrate, e.g., DBC substrate, AMB substrate, IMB substrate, etc., and a custom plastic housing. The arrangement is adaptable to different semiconductor package types and/or different semiconductor package sizes, and specific solutions are described herein for incorporating these different package types and/or package sizes into the assembly at minimal cost and complexity. By constructing the arrangement using complete semiconductor packages instead of bare semiconductor dies, a significant cost savings can be realized, as the semiconductor packages used to construct the assembly can be mass produced products that are pre-qualified.

Referring to FIG. 1, a semiconductor package 100 is depicted. The semiconductor package 100 comprises a semiconductor die 102, an encapsulant body 104, a die pad 106, and a plurality of conductive leads 108 that are exposed from edge sides of the encapsulant body 104. The encapsulant body 104 may comprise an electrically insulating material such as mold compound, epoxy, thermosetting plastic, polymer, etc. According to an embodiment, the encapsulant body 104 is a molded plastic structure that is formed by a molding process such injection molding, transfer molding, compression molding, etc. The die pad 106 and the leads 108 can be part of a metal lead frame structure formed from copper (Cu), aluminum (Al), nickel (Ni), nickel phosphorous (NiP), silver (Ag), palladium (Pd) gold (Au), etc., alloys or combinations thereof.

The semiconductor die 102 is mounted on the die pad 106, e.g., by a solder or sinter material, and the terminals of the semiconductor die 102 are electrically connected to the leads 108. According to an embodiment, the semiconductor die 102 is a vertical power transistor such as a MOSFET, IGBT that is rated to voltages of at least 600 V, 1200V, etc., between first and second load terminals, wherein the first and second terminals correspond to the source, drain, collector or emitter terminals, as the case may be. The first load terminal faces and is electrically connected to the die pad 106 and the second load terminal faces away from the die pad and 106 and is electrically connected to the leads 108 by electrical interconnect elements such as bond wires (as shown), metal clips, ribbons, etc. The gate terminal of the semiconductor die 102 may be electrically connected to one of the leads 108, and another one of the leads 108 may provide a sense connection to the second load terminal.

The semiconductor packages 100 is configured as an SMD (surface mount device). An SMD refers to a device that is configured to be mounted on a carrier structure, such as a PCB, with the electrical contacts of the device (in this case the leads 108) facing and electrically connected to corresponding bond pads on the carrier structure. To this end, the leads 108 of the semiconductor packages 100 are bent in such a way that the contacting surfaces of the leads 108 are substantially coplanar with a mounting side of the encapsulant body 104.

FIGS. 1C and 1D illustrate two types of SMDs with different cooling configurations. The semiconductor package 100 in FIG. 1C has a bottom-side cooling configuration. According to this configuration, the leads 108 are bent in the same direction as the die pad 106 so that when the semiconductor package 100 is mounted on a carrier structure, the die pad 106 is flush against the same carrier structure that the leads 108 are electrically connected to. The semiconductor package 100 in FIG. 1D has a top-side cooling configuration. According to this configuration, the leads 108 are bent in the opposite direction as the die pad 106 so that when the semiconductor package 100 is mounted on a carrier structure, the die pad 106 faces away from the carrier structure and is accessible. The semiconductor packages 100 may also have a so-called dual side cooling configuration wherein a second die pad 106 and/or metal structure such as a metal clip is exposed at an opposite side of the encapsulant body 104 as the die pad 106.

Referring to FIG. 2, a semiconductor device assembly 200 that comprises a plurality of the semiconductor packages 100 is depicted. In this assembly 200, the various semiconductor packages 100 may have the bottom-side cooling configuration, the top-side cooling configuration, the dual-side cooling configuration, or any combination thereof. Accordingly, the location of the die pads 106 is schematically represented by dashed lines in the figure.

The semiconductor device assembly 200 comprises a cooling system 202. The cooling system 202 is a heat sink structure that is adapted to extract heat from multiple semiconductor devices simultaneously. Generally speaking, the cooling system 202 can comprise any thermally conductive material, e.g., metals such as copper, silver, aluminum, etc., and alloys thereof, and other thermal materials such as diamond, silicon carbide, etc. According to an embodiment, the cooling system 202 is a fluid-based cooling system 202 that comprises a fluid 203 and is configured to actuate the fluid 203 through one or more channels so as to move the fluid 203 across the plurality of semiconductor packages 100. In this context, the term "fluid" refers both to liquids, e.g., water, coolant oils or other non-toxic liquids, and gasses such as ambient air, hydrogen, helium, etc. Instead of a fluid-based system, the cooling system 202 may be configured as another type of heat sink structure, e.g., a metal structure comprising a plurality of fin-like structures.

The semiconductor device assembly 200 comprises a multi-device thermal interface 204 that is interposed between the plurality of semiconductor packages 100 and the cooling system 202. The multi-device thermal interface 204 thermally couples each of the semiconductor packages 100 to the cooling system 202. That is, the multi-device thermal interface 204 forms a thermally conductive path between each of the semiconductor packages 100 and the cooling system 202. To this end, the multi-device thermal interface 204 may comprise one or more regions of thermally conductive material. For example, the multi-device thermal interface 204 can comprise a metal structure that is formed from metals such as copper, aluminum, silver, gold, nickel, etc., and alloys or combinations thereof. Separately or in combination, the multi-device thermal interface 204 can comprise gap filler material. Gap filler material refers to a fluid or gelatinous material that is used in electronics applications to replace a thermally insulating air gap with a thermally conductive medium. Generally speaking, gap filler material can have a thermal conductivity in the range of 1 W/m-K to 10 W/m-K. Gap filler materials include silicone gels and urethane polymers. Gap filler materials can be dispensed or otherwise formed in any desired shape around the exterior of a semiconductor package 100.

In addition to acting as a thermal conduction path between the plurality of semiconductor packages 100 and the cooling system 202, the multi-device thermal interface 204 may be configured to provide electrical isolation between different ones of the of the semiconductor packages 100 and/or or between the semiconductor packages 100 and the cooling system 202. To this end, the multi-device thermal interface 204 may comprise one or more dielectric regions. For example, the multi-device thermal interface 204 can comprise thermal interface material (TIM). Thermal interface material refers to a thermally conductive and electrically insulating material that is used in electronics applications to thermally couple two elements wherein electrical isolation between the two elements is needed. Thermal interface material is typically soft material, e.g., having a compressibility of eat least 25% measured on the Vickers scale, that is formed from a polymer. Thermal interface material can have a thermal conductivity in the range of 1 W/m-K to 10 W/m-K. According to an embodiment, the multi-device thermal interface 204 comprises a layer of thermal interface material. This layer of thermal interface material may cover a complete surface of the cooling system 202 so as to completely electrically isolate the cooling system 202 from the subjacent semiconductor packages 100 from the cooling system 202. Separately or in combination, the multi-device thermal interface 204 can comprise an attachable electrical isolation foil, which has similar properties to thermal interface material, but is provided in sheet format with an adhesive. Separately or in combination, the multi-device thermal interface 204 may comprise other dielectric materials such as ceramic, e.g., $Al_2O_3$, AlN, SiN, BN, etc., prepreg material, FR-4, CEM-1, G-10, etc., glass, liquid, air, etc. While these dielectric materials typically reduce thermal conductivity, the thickness of the regions comprising the dielectric materials can be selected to balance a trade-off between dielectric strength and thermal conductivity.

The semiconductor device assembly 200 further comprises a carrier 206. The carrier 206 is a device that accommodates the mounting of one or more semiconductor devices thereon. The carrier 206 comprises an electrically insulating region 208 and a structured metallization layer 210 which forms a mounting surface of the carrier 206. According to an embodiment, the carrier 206 is a PCB (printed circuit board). In that case, the electrically insulating region 208 can comprise one or more laminate layers. These laminate layers can comprise epoxy materials, blended epoxy and glass fiber materials such as FR-4, FR-5, CEM-4, etc., and resin materials such as bismaleimide trazine (BT) resin. The structured metallization layer 210 can be attached to the electrically insulating region 208 as part of the lamination process, for example. The structured metallization layer 210 can be structured into bond pads, die attach pads, and conductive interconnect tracks, for example. According to another embodiment, the carrier 206 is a power electronics substrate. Examples of power electronics substrates include isolated metal substrates (IMS), direct copper bonding (DCB) substrates, or active metal brazed (AMB) substrates, for example. In that case, the electrically insulating region 208 can comprise a layer of ceramic such as silicon dioxide, aluminum oxide, aluminum nitride, zirconium oxide, silicon nitride, boron nitride, epoxy resin, polyimide, etc. The structured metallization layer 210 can be bonded to the layer of ceramic by an adhesive or brazing process, for example. The structured metallization layer 210 can be structured into bond pads, die attach pads, and conductive interconnect tracks, for example. A power electronics substrate may additionally comprise a second metallization layer (not shown) disposed on an opposite side of the electrically insulating region 208 as the structured metallization layer 210, which may be used to thermally couple the power electronics substrate to a heat sink. In any case, the metallization layers of the carrier 206 can comprise or be plated with Cu, Ni, Ag, Au, Pd, Pt, for example.

A plurality of the semiconductor packages 100 is mounted on the carrier 206 with the leads 108 of the semiconductor packages 100 being affixed and electrically connected to bond pads formed in the structured metallization layer 210. For example, the leads 108 may be attached by a conductive adhesive such as solder, sinter, conductive glue, etc. Additionally, in the case of a bottom-side or dual-side cooling configuration, the die pads 106 of the semiconductor packages 100 may be attached and electrically connected to the bond pads formed from the structured metallization layer 210. In any case, the bottom sides of the semiconductor packages 100 as well as the leads 108 may be thermally coupled to the carrier 206.

Before mounting the plurality of semiconductor packages 100 on the carrier 206, each of the semiconductor packages 100 may be completely manufactured and tested. This may be done by the same or different manufacturer that produces the carrier 206 and the cooling system 202. In any case, the semiconductor packages 100 may undergo typical semiconductor device qualification process such as functional verification and electrical/thermal stress testing, wherein the devices that do not pass are discarded and not used.

FIG. 2A depicts an arrangement wherein the carrier 206 is disposed below the plurality of semiconductor packages 100, and the multi-device thermal interface 204 and the cooling system 202 are disposed above the carrier 206. In this case, some or all of the semiconductor packages 100 may have a top-side cooling configuration wherein the die pad 106 of these semiconductor packages 100 faces away from the carrier 206. The die pads 106 of the semiconductor packages 100 that face away from the carrier 206 may be thermally coupled to the cooling system 202 via the multi-device thermal interface 204. The carrier 206 may serve as an electrical redistribution structure by providing electrical interconnections between some or all of the semiconductor packages 100. The carrier 206 may also provide additional heat extraction from the semiconductor packages 100 as well.

FIG. 2B depicts an arrangement wherein the multi-device thermal interface 204 and the cooling system 202 are each disposed below the plurality of semiconductor packages 100. In this case, the multi-device thermal interface 204 may serve a dual role. First, the multi-device thermal interface 204 may provide the previously described function of a thermal interface by thermally coupling the semiconductor packages 100 to the cooling system 202. To this end, some or all of the semiconductor packages 100 may have the bottom-side cooling configuration wherein the die pad 106 of these semiconductor packages 100 face the multi-device thermal interface 204 and are thermally coupled to the cooling system 202 via the multi-device thermal interface 204. Second, the multi-device thermal interface 204 may provide the previously described function of the carrier 206 by accommodating the mounting of the semiconductor packages 100 on a structured metallization layer. To this end, the multi-device thermal interface 204 may comprise conductive tracks and/or be configured as an electrical redistribution structure by providing electrical interconnections between some or all of the semiconductor packages 100.

In either one of the semiconductor arrangements described with reference to FIGS. 2A and 2B, at least some of the semiconductor packages 100 may comprise a top-side element 212 that is attached to the die pad 106. The top-side element 212 may be an exposed structure that is disposed on an opposite side of the assembly as the cooling system 202, e.g., in the assembly of FIG. 2B. In that case, the top-side element 212 may comprise a thermally conductive material, e.g., copper, aluminum, etc., and may serve as a heat sink structure which, in combination with the cooling system 202, removes heat from the plurality of semiconductor packages 100. Alternatively, the top-side element 212 may be a structure that is interposed between the semiconductor packages 100 and the cooling system 202, e.g., in the assembly of FIG. 2A. In that case, the top-side element 212 may comprise a thermally conductive material, e.g., copper, aluminum, etc., and be thermally coupled to the multi-device thermal interface 204 so as to enhance heat transfer between the between the semiconductor packages 100 and the cooling system 202. Separately or in combination, the top-side element 212 may comprise an electrically insulating structure or comprise an electrically insulating material, e.g., ceramic, silicon dioxide, aluminum oxide, aluminum nitride, zirconium oxide, silicon nitride, boron nitride, epoxy resin, polyimide, etc. In one particular example of this configuration, the top-side element 212 may comprise a segment of a power electronics substrate. By including an electrical insulator, the top-side element 212 may be used to provide electrical isolation between the semiconductor packages 100 and the and the multi-device thermal interface 204 and/or the cooling system 202.

Figure 3A:
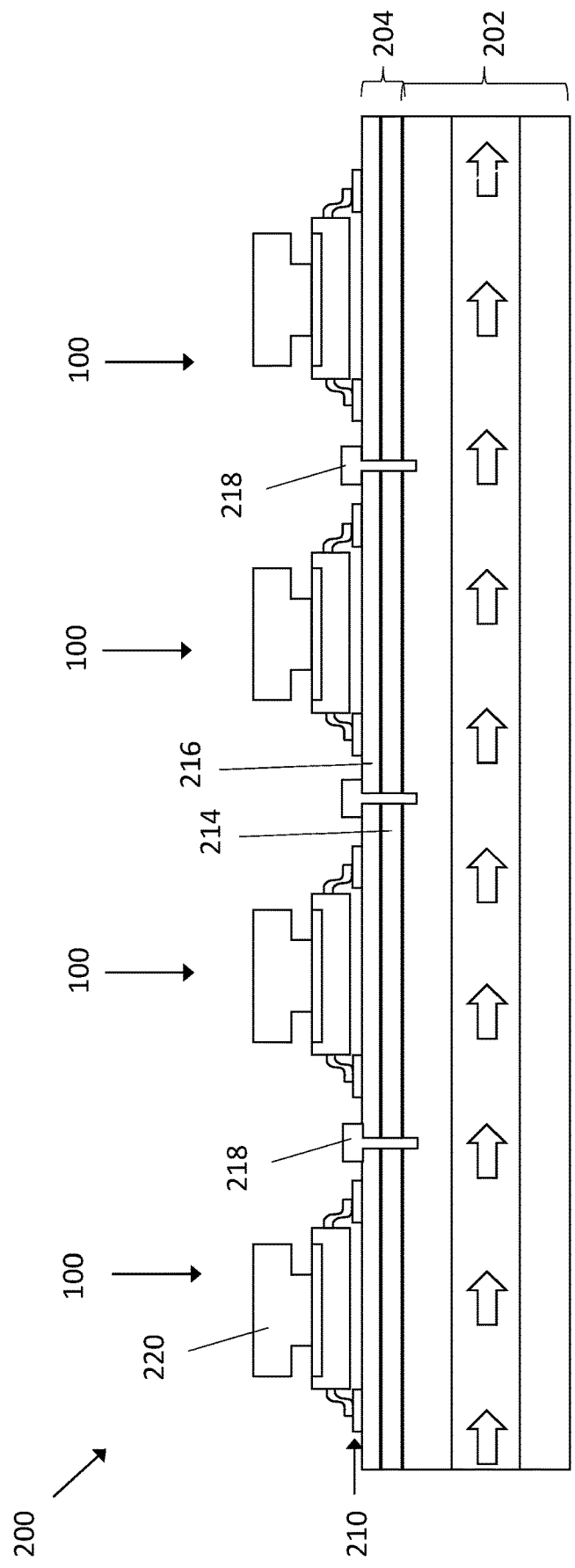
FIGS. 3A-3C, illustrates a semiconductor device assembly with a plurality of semiconductor packages thermally coupled to a cooling system by a multi-device thermal interface, according to an embodiment.
Figure 3B:
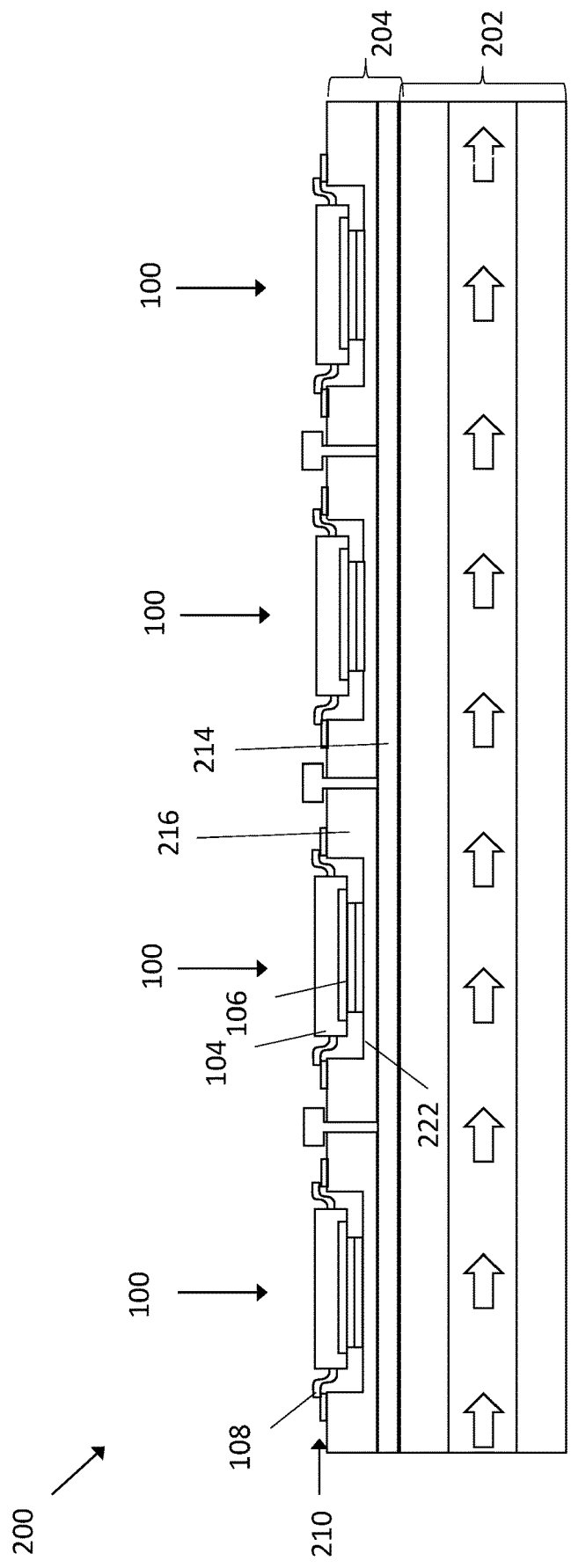
Figure 3C:
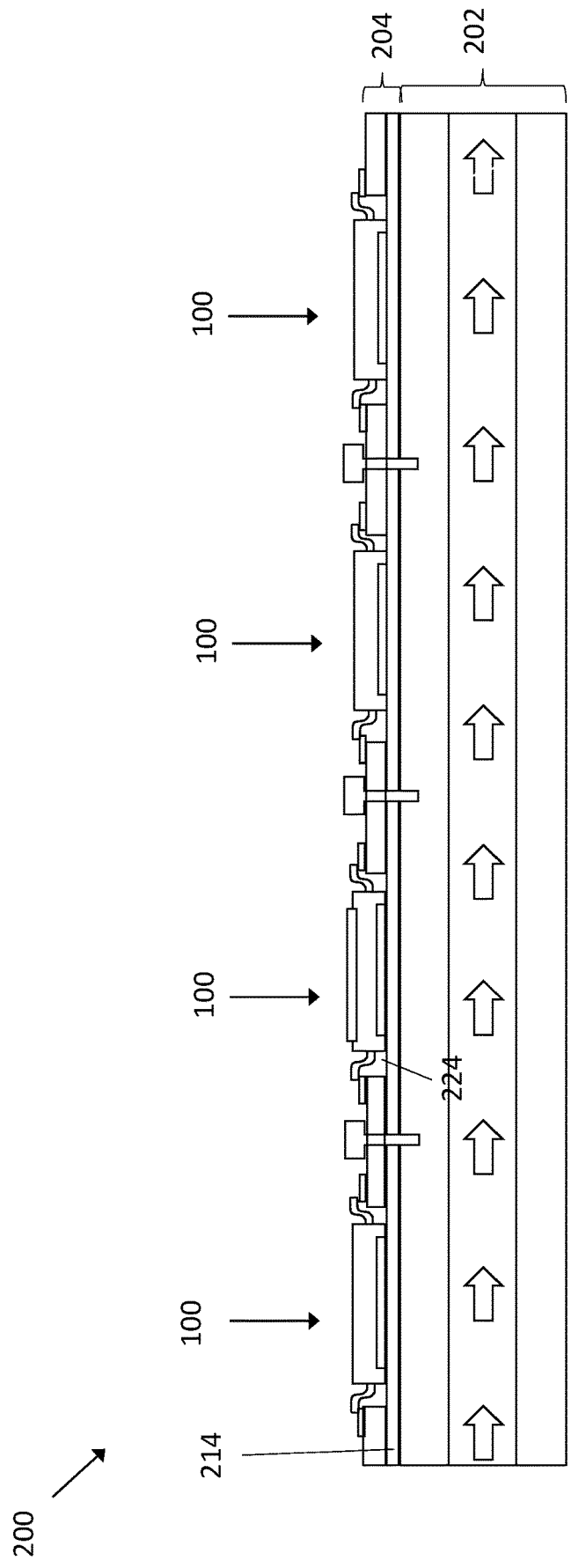

Referring to FIG. 3, a semiconductor device assembly 200 wherein the multi-device thermal interface 204 and the cooling system 202 are each disposed below the plurality of semiconductor packages 100 is depicted, according to an embodiment. In this embodiment, the multi-device thermal interface 204 comprises a layer of thermally conductive material 214 that is flush against a surface of the cooling system 202. The layer of thermally conductive material 214 can be a layer of electrical isolation material or a layer of metallization, for example. The multi-device thermal interface 204 further comprises a layer of electrically insulating material 216 interposed between the semiconductor packages 100 and the cooling system 202. The layer of electrically insulating material 216 can comprise material such as resin, ceramic, epoxy, etc.

According to an embodiment, the multi-device thermal interface 204 comprises a PCB. In that case, the layer of thermally conductive material 214 can be a thick metal layer that is disposed on a bottom side of the PCB, and the layer of electrically insulating material 216 corresponds to a laminated layer of prepreg material from the PCB. The PCB may further comprise a structured metallization layer 210 disposed on the laminated layer of prepreg material which accommodates the mounting of semiconductor packages 100 thereon. The structured metallization layer 210 may be relatively thin in comparison to the thick metal layer that is disposed on a bottom side of the PCB.

The multi-device thermal interface 204 may be attached to the cooling system 202 by fasteners 218 that extend through the multi-device thermal interface 204. These fasteners 218 may be any type of fastening element, e.g., screw, pin, bolt, etc. The fasteners 218 may be electrically isolated from the semiconductor packages 100 and hence maintain isolation between the semiconductor packages 100 and the layer of thermally conductive material 214 by extending through isolated regions of the layer of electrically insulating material 216. Alternatively, the fasteners 218 may form electrical connections between the semiconductor packages 100 and a lower metallization layer by extending through bond pad portions of the structured metallization layer 210.

In the embodiment of FIG. 3A, the semiconductor packages 100 have a top-side cooling configuration and are arranged such that the die pad 106 faces away from the cooling system 202. The semiconductor device assembly 200 may further comprise a plurality of metal heat sinks 220 that are separately mounted to the die pads 106 of the semiconductor packages 100. In this case, The metal heat sinks 220 can be attached to the exposed die pads 106 of the semiconductor packages 100 by a layer of adhesive, e.g., solder, sinter, glue, etc. The metal heat sinks 220 can comprise a thermally conductive metal such a copper, aluminum, silver, etc., and alloys thereof, and are designed to radiate extracted heat through the air. The dual-sided cooling arrangement of FIG. 3A may be advantageous in applications requiring pulse cooling with large amounts of energy transfer, e.g., 10 W-1,000 W occurring in a short amount of time, e.g., between 0.1-10 seconds. The metal heat sinks 220 can act as a heat buffer that absorbs additional heat during these sporadic but thermally intense pulse intervals and gradually dissipates the heat after the pulse interval is over, thereby avoiding destruction of the semiconductor devices.

Referring to FIG. 3B, the semiconductor packages 100 with the top-side cooling configuration may alternatively be arranged such that the die pad 106 faces the cooling system 202. In comparison to the embodiment of FIG. 3A, the semiconductor packages 100 are flipped upside down such that the leads 108 contact the structured metallization layer 210 from an opposite side. To accommodate this arrangement, the multi-device thermal interface 204 may be configured to comprise depressions 222 that are formed in the layer of electrically insulating material 216 and are dimensioned to accommodate the semiconductor packages 100. The semiconductor packages 100 are mounted such that the encapsulant body 104 of the semiconductor packages 100 extends into the depressions 222. The decreased thickness in the layer of electrically insulating material 216 provided by the depressions 222 advantageously improves thermal coupling between the semiconductor dies 102 and the cooling system 202. The die pad 106 of the semiconductor packages 100 can be thermally coupled to the bottom surfaces of the depressions 222 by a layer of adhesive, e.g., solder, sinter, glue, etc. Moreover, an additional metal region, such as a structured region of metallization similar or identical to the contact pads from the structured metallization layer 210 may be provided at the bottom surface of the depressions 222 to enhance adhesion and/or thermal coupling.

Referring to 3C, another example of the assembly 200 wherein the semiconductor packages 100 with the top-side cooling configuration are arranged such that the die pad 106 faces the cooling system 202 is shown. In this case, the layer of thermally conductive material 214 that is flush against a surface of the cooling system 202 can be a layer of thermal interface material. The structure above the layer of thermally conductive material 214 can be a PCB as described above, except that there is no thick metal layer that is disposed on a bottom side of the PCB, and the depressions 222 are replaced by complete openings 224 that extend through the laminate material and the first structured metallization layer 210.

In any of the assemblies 200 described with reference to FIG. 3, the following sequence of steps may be performed to create the assembly 200. Initially, a soldering step may be performed wherein the leads 108 of the semiconductor packages 100 are soldered to the structured metallization layer 210. If present, the metal heat sinks 220 can be soldered to the exposed die pads 106 at the upper surfaces of the semiconductor packages 100. The metal heat sinks 220 can be soldered by a common reflow step that also solders the leads 108 of the semiconductor packages 100 to the structured metallization layer 210. Alternatively, these steps may be performed separately. Subsequently, the assembly comprising the semiconductor packages 100 on the multi-device thermal interface 204 can be secured to the cooling system 202, e.g., by inserting the fasteners 218 through the multi-device thermal interface 204 and the cooling system 202.

Figure 4:
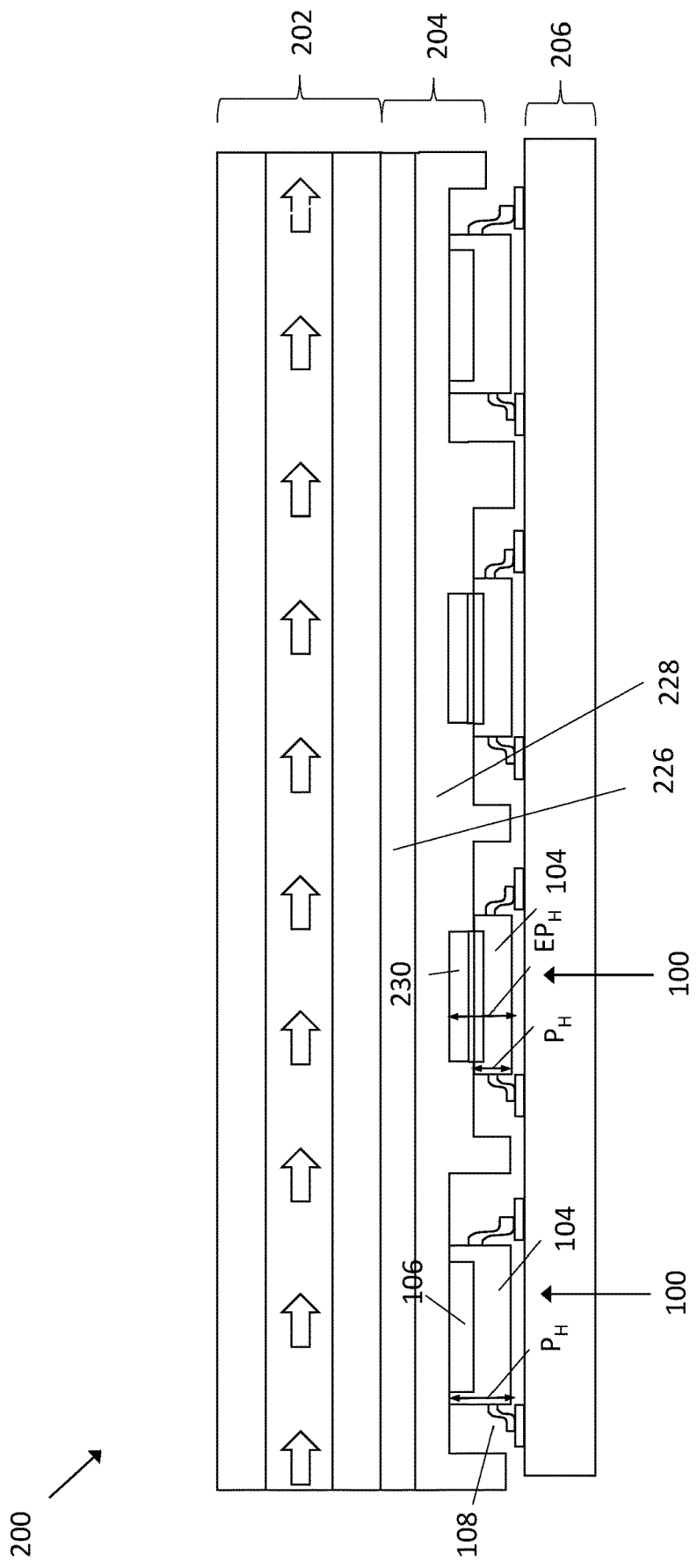
FIG. 4 illustrates a semiconductor device assembly with a plurality of semiconductor packages thermally coupled to a cooling system by a multi-device thermal interface, according to an embodiment.

Referring to FIG. 4, a semiconductor device assembly 200 is depicted, according to another embodiment. In this embodiment, the carrier 206 is disposed below the plurality of semiconductor packages 100, and the multi-device thermal interface 204 and the cooling system 202 are disposed above the carrier 206. According to an embodiment, the carrier 206 is a PCB.

The multi-device thermal interface 204 comprises a layer of thermal interface material 226 that is flush against a surface of the cooling system 202. The multi-device thermal interface 204 additionally comprises a gap filler material 228 that is arranged between the semiconductor packages 100 and the layer of thermal interface material 226. As can be seen, the gap filler material 228 can be disposed between the semiconductor packages 100 and the layer of thermal interface material 226 can fill areas laterally between the semiconductor packages 100.

According to an embodiment, a package height $P_H$ of a first one the semiconductor packages 100 is less than a package height $P_H$ of a second one the semiconductor packages 100. In this context, package height $P_H$ refers to a distance between contacting surfaces of the leads 108 and an upper side of the encapsulant body 104 of the semiconductor packages 100 opposite from the leads 108. It may be desirable to accommodate semiconductor packages 100 of different package height $P_H$ in a single assembly 200 for a variety of reasons. For example, semiconductor packages 100 of different device types may be used and/or may come from different suppliers. As the multi-device thermal interface 204 comprises a gap filler material 228 that is malleable, the system can therefore accommodate the differently sized semiconductor packages 100 while simultaneously thermally coupling each of the semiconductor packages 100 to the cooling system 202.

According to an embodiment, the second one of the semiconductor packages 100 having the lesser package height $P_H$ comprises a die pad extension 230 that is attached to its die pad 106. The die pad extension 230 is a thermally conductive structure that may be formed from similar or identical materials as the die pad 106, e.g., copper, aluminum, alloys thereof, etc. The die pad extension 230 improves the thermal efficiency of the multi-height package arrangement by replacing a vertical thickness of the gap filler material 228 with a metal. Moreover, the die pad extension 230 allows for more stable mounting of the cooling system 202 and the multi-device thermal interface 204 on top of the semiconductor packages 100 by minimizing height discrepancy between the semiconductor packages 100. According to an embodiment, an effective package height $EP_H$ of the second one of the semiconductor packages 100 between the contacting surfaces of the leads 108 and an upper surface of the die pad extension 230 is substantially close to (e.g., within +/−5%) the package height $P_H$ of the first one the semiconductor packages 100 that does not comprise the die pad extension 230. While the illustrated embodiment only shows semiconductor packages 100 with two different package heights $P_H$, this concept is more generally applicable to assemblies comprising semiconductor packages 100 with three or more different package heights $P_H$.

Figure 5:
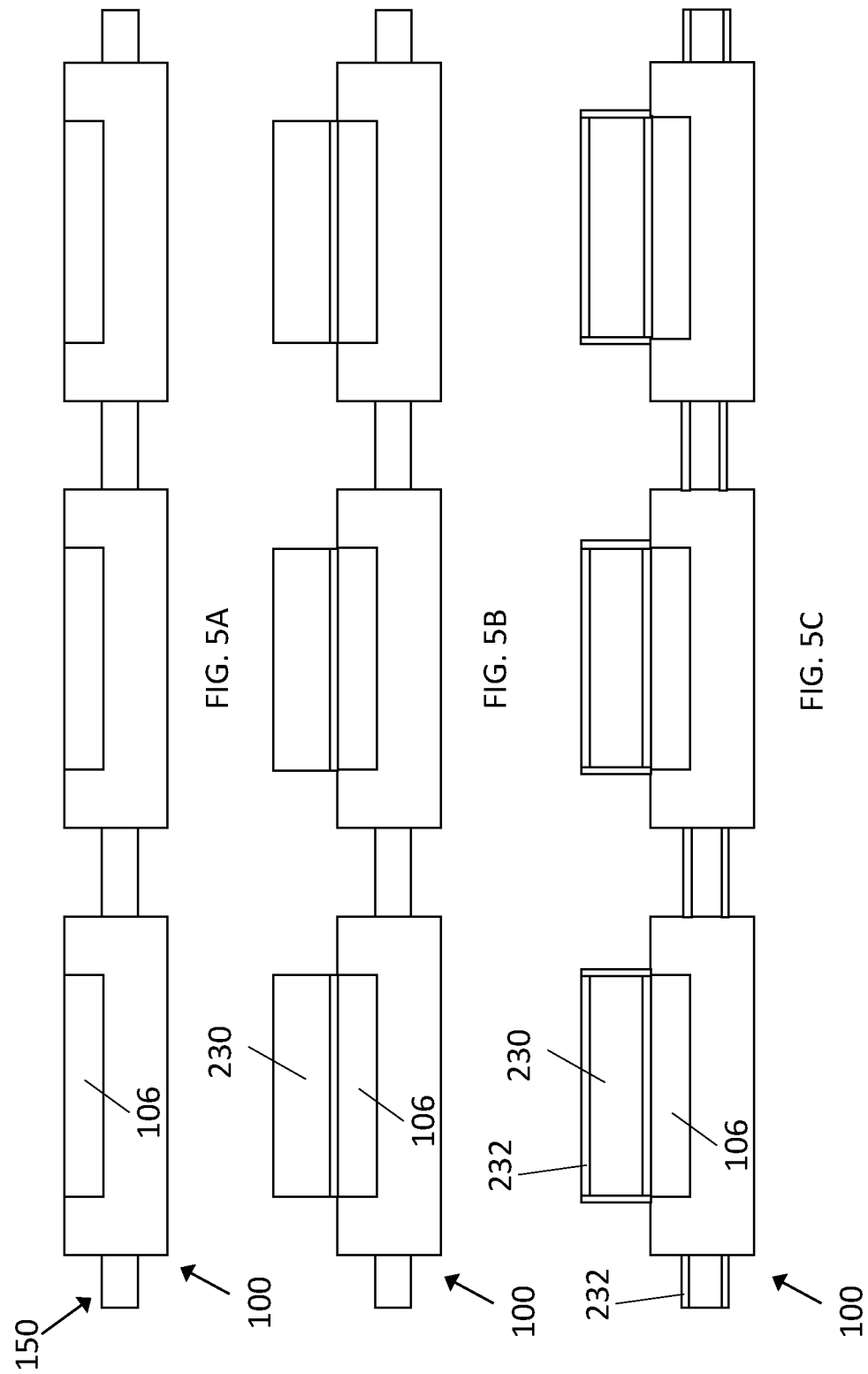
FIG. 5, which includes

Referring to FIG. 5, a technique providing the die pad extension 230 on the semiconductor package 100 is illustrated, according to an embodiment. As shown in FIG. 5A, a plurality of the semiconductor packages 100 are formed from a metal lead frame 150. As shown in FIG. 5B, before performing a lead trimming step, the die pad extensions 230 are attached to the exposed die pads 106 of the semiconductor packages 100. This may be done using a thermally conductive adhesive, e.g. solder, sinter, conductive glue, etc. As shown in FIG. 5C, a plating step is performed to deposit a metal plating 232 on all exposed metal surfaces of the semiconductor packages 100. The metal plating 232 can be an anti-corrosion layer and/or an adhesion promotion layer, for example. According to an embodiment, the metal plating 232 comprises Sn.

Figure 6:
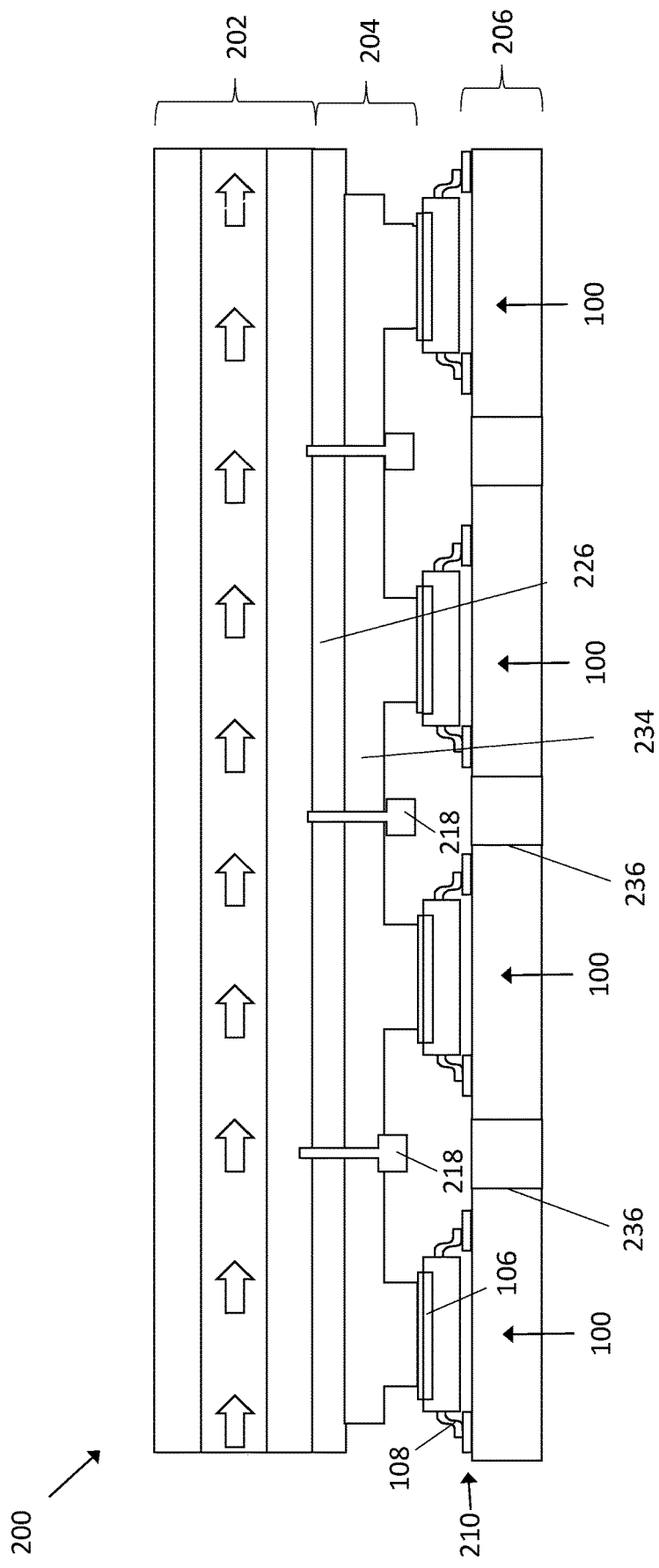
FIG. 6 illustrates a semiconductor device assembly with a plurality of semiconductor packages thermally coupled to a cooling system by a multi-device thermal interface, according to an embodiment.

Referring to FIG. 6, a semiconductor device assembly 200 is depicted, according to another embodiment. In this embodiment, the carrier 206 is disposed below the plurality of semiconductor packages 100, and the multi-device thermal interface 204 and the cooling system 202 are disposed above the carrier 206. According to an embodiment, the carrier 206 is a PCB.

The multi-device thermal interface 204 comprises a metal bridge 234 that is thermally coupled to each of the semiconductor packages 100. Different to the gap filler material 228 used in the embodiment of FIG. 4, the metal bridge 234 is a substantially rigid structure that is formed from a metal such as copper, aluminum, silver, etc., and alloys thereof. This provides a highly efficient mechanism for heat transfer between the semiconductor packages 100 and the cooling system 202. The die pads 106 from each of the semiconductor packages can be attached and thermally coupled the metal bridge 234, e.g., by an adhesive such as solder, sinter, glue. etc.

The multi-device thermal interface 204 additionally comprises a layer of thermal interface material 226 that is flush against a surface of the cooling system 202. The layer of thermal interface material 226 electrically isolates the semiconductor packages 100 from the cooling system 202 in a similar manner as previously described.

The cooling system 202 can be secured to the metal bridge 234 by a plurality of fasteners 218. Initially, the semiconductor packages 100 can be mounted on the carrier 206, e.g., by soldering the leads 108 to the structured metallization layer 210. Separately or concurrently, the metal bridge 234 can be attached to the die pad 106. This may be done using an adhesive, e.g., solder, sinter, etc. Subsequently, the cooling system 202 may be affixed to the metal bridge 234 structure using the fasteners 218. The carrier 206 may comprise a plurality of openings 236 that allow for the insertion and removal of the fasteners 218. In the completed assembly, the openings 236 are each aligned with the plurality of fasteners 218 such that the fasteners 218 are accessible, via the openings 236, e.g., by a screwdriver, drill bit, etc.

Figure 7:
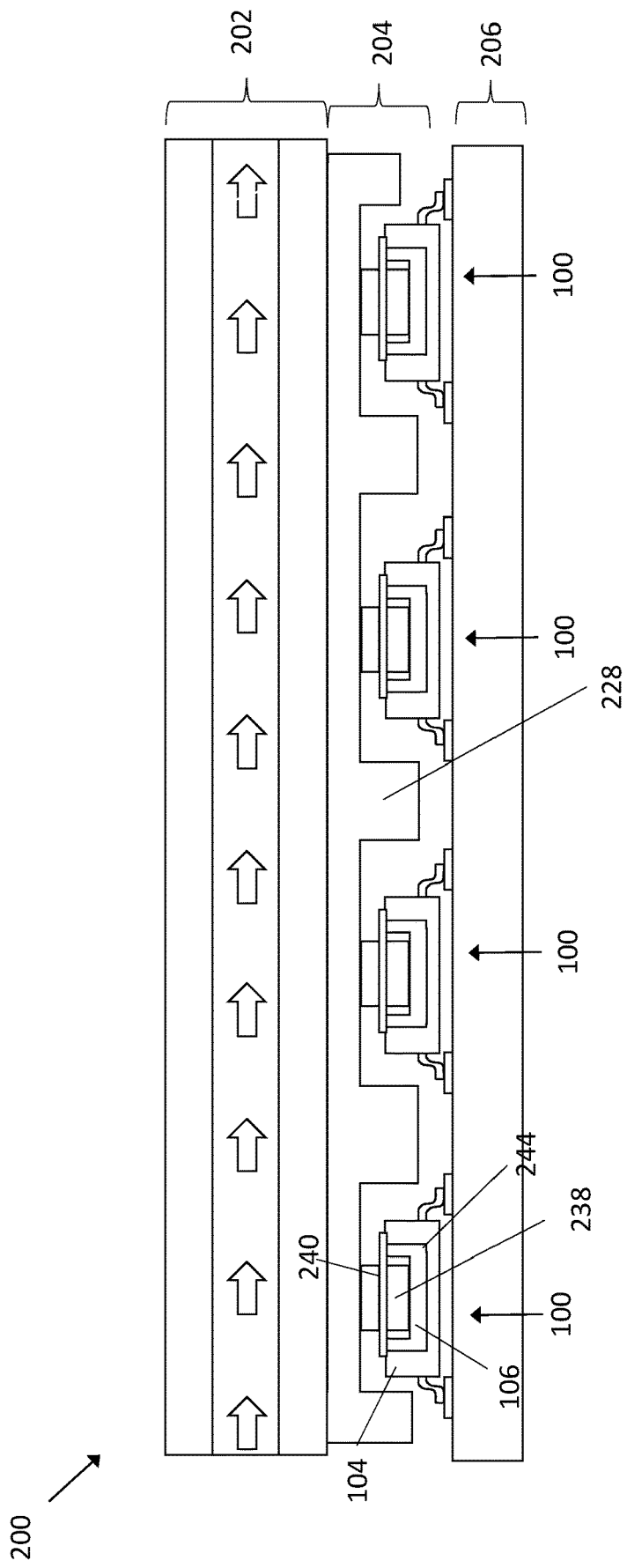
FIG. 7 illustrates a semiconductor device assembly with a plurality of semiconductor packages thermally coupled to a cooling system by a multi-device thermal interface, according to an embodiment.

Referring to FIG. 7, a semiconductor device assembly 200 is depicted, according to another embodiment. In this embodiment, the carrier 206 is disposed below the plurality of semiconductor packages 100, and the multi-device thermal interface 204 and the cooling system 202 are disposed above the carrier 206. According to an embodiment, the carrier 206 is a PCB.

The multi-device thermal interface 204 comprises a gap filler material 228 that is arranged between the semiconductor packages 100 and the cooling system 202. The gap filler material 228 thermally couples each of the semiconductor packages 100 to the cooling system 202 in a similar manner previously described. The gap filler material 228 may directly interface with the cooling system 202. Thus, different to be embodiment of FIG. 4, there is no layer of layer of thermal interface material 226 between the cooling system 202 and the gap filler material 228.

In the embodiment of FIG. 7, each of the semiconductor packages 100 comprise electrical isolation structures 238 that are disposed between the die pads 106 of the semiconductor packages 100 and the cooling system 202. These electrical isolation structures 238 electrically isolate the die pads 106 from the cooling system 202 and therefore eliminate the need for an additional electrical isolation barrier, such as an electrical isolation material. Generally speaking, the electrical isolation structures 238 can comprise at least one dielectric layer 240 with suitable dielectric strength to provide the necessary electrical isolation. For example, the electrical isolation structures 238 can comprise a dielectric layer 240 of ceramic, prepreg material, glass, etc. According to an embodiment, the electrical isolation structures 238 comprise discrete segments of a power electronics substrate. For instance, the electrical isolation structures 238 can comprise segments of a DBC substrate, an AMB substrate or an IMS substrate, wherein the dielectric layer 240 comprises a ceramic. As the total size of these segments used in the assembly 200 is substantially less than the total area of a power electronics substrate used as the base substrate in a power module, this concept can provide a significant cost savings in comparison to the power module, while simultaneously providing some of the thermal performance benefits of a power electronics substrate.

According to an embodiment, the die pad 106 of each of the semiconductor packages 100 comprises a depressed receptacle 244 that extends below the upper surface of the encapsulant body 104. This depressed receptacle 244 is dimensioned to receive the electrical isolation structures 238 so as to minimize the vertical displacement of the semiconductor packages 100 and/or enhance attachment of the electrical isolation structures 238 to the semiconductor packages 100.

Referring to FIG. 8, a technique for providing the depressed receptacle 244 in the semiconductor packages 100 and attaching the electrical isolation structures 238 is illustrated, according to an embodiment. As shown in FIG. 8A, a plurality of the semiconductor packages 100 are formed from a metal lead frame 150. The depressed receptacles 244 can be formed in the die pads 106, e.g., using a chemical etching technique or a mechanical removal technique such as grinding. As shown in FIG. 8B, a layer of conductive adhesive 246 is provided in the bottom surface of the depressed receptacle 244. The conductive adhesive 246 can be a layer of solder, sinter, conductive glue, etc. As shown in FIG. 8C, the electrical isolation structures 238 are attached to the die pad 106 via the adhesive conductive adhesive 246.

Referring to FIG. 9, a semiconductor device assembly 200 is depicted, according to another embodiment. In this embodiment, the semiconductor device assembly 200 comprises a cooling system 202 and a multi-device thermal interface 204 disposed the above the plurality of semiconductor packages 100. According to an embodiment, the multi-device thermal interface 204 comprises an electrical isolation foil 247 that is flush against a surface of the cooling system 202, and a gap filler material 228 that is thermally coupled between the semiconductor packages 100 and the electrical isolation foil 247. The assembly 200 further comprises a carrier 204 that each of the semiconductor packages 100 are mounted on. According to an embodiment, the carrier 204 is a power electronics substrate, e.g., DBC substrate, IMS substrate, AMB substrate, etc. The power electronics substrate may comprise a first structured metallization layer 210 that is disposed on an upper surface of the substrate. This first structured metallization layer 210 can be structured to provide contact pads that provide electrical interconnect between the various semiconductor packages 100, provide a cooling structure that draws heat away from the semiconductor packages 100, or both.

The semiconductor device assembly 200 additionally comprises a second cooling system 202 disposed below the carrier 204. By using a carrier 204 with electrical isolation properties and thermal conductive properties such as a power electronics substrate, electrical isolation from and thermal coupling to the second cooling system 202 is possible. Generally speaking, the second cooling system 202 that is below the carrier 204 can be similar or identical to the cooling system 202 disposed above the semiconductor packages 100. According to an embodiment, the second cooling system 202 is a liquid-based cooling system 202 that is configured to actuate a liquid, e.g., a cooling oil or water, through the second cooling system 202. Meanwhile, the cooling system 202 that is disposed above the plurality of semiconductor packages 100 may be an air-based cooling system that is configured to actuate a gas, e.g., ambient air, through this cooling system 202.

In the semiconductor device assembly 200 of FIG. 9, the plurality of semiconductor packages 100 comprises a combination of the top-side cooling configured semiconductor packages 100 and the bottom-side cooling configured semiconductor packages 100. Hence, the die pad 106 of a first one of the semiconductor packages 100 faces in an opposite direction as the die pad 106 of a second one of the semiconductor packages 100. The cooling systems 202 disposed above and below the semiconductor packages 100 allow for efficient heat extraction of the differently configured semiconductor packages 100 in both directions.

Figure 9A:
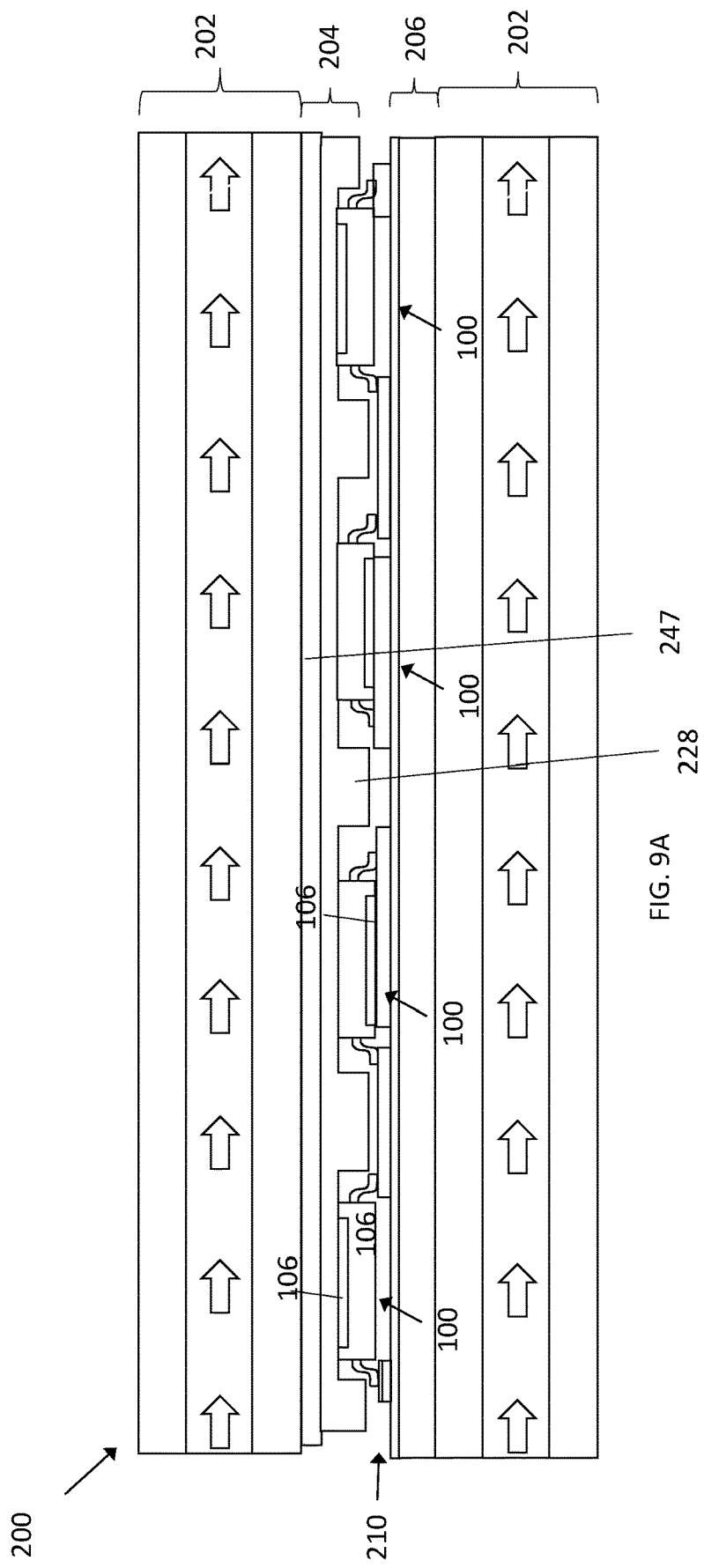

Referring to FIG. 9B one potential arrangement of the semiconductor packages 100 on the carrier 106 from the assembly 100 from FIG. 9A is shown. In this example, two of the semiconductor packages 100 are mounted on a first contact pad 248 of the first metallization layer 210. This first contact pad 248 may occupy most of the area underneath these semiconductor packages 100, including the entire area below the leftmost semiconductor package 100 of the figure. The first contact pad 248 therefore provides a thermal dissipation structure for both of the semiconductor packages 100. Additionally, the first contact pad 248 may provide electrical interconnect between the semiconductor packages 100. The structured metallization layer 210 further comprises a second contact pad 250 and a third contact pad 250. The second contact pad 250 and the third contact pad 250 form separate terminals that are electrically connected to the outermost leads 108 of the semiconductor packages 100.

The two semiconductor packages mounted on the first contact pad 248 may be different components of a power circuit. According to one embodiment, one of the semiconductor packages 100 is configured as a power transistor and the other one of the semiconductor packages 100 is configured as a discrete power diode. The discrete power diode may be as a power-factor correction element, for example. In that case, the first contact pad 248 may form an electrical connection between the drain of the discrete power transistor and the anode of the discrete power diode. According to another embodiment, both of semiconductor packages 100 are configured as discrete power transistors and are arranged to form a half-bridge circuit. In that case, the first contact pad 248 may form electrical connection between the source and drain terminals of the semiconductor packages 100, i.e., the output terminal of the half-bridge circuit. The second contact pad 250 and the third contact pad 250 may provide the reference potential terminals and/or the gate terminals of the half-bridge circuit.

The semiconductor package 100 described with reference to FIG. 1 represents just one particular example of a semiconductor package that may be incorporated into the semiconductor device assembly 200 disclosed herein. Some or all of the semiconductor packages 100 in the semiconductor device assembly 200 may have different lead configurations from what is shown, such as other types of SMT device configurations, e.g. DFN, QFN, etc. Internally, the semiconductor packages 100 may comprise one or multiple semiconductor dies. For example, the semiconductor package 100 may comprise multiple dies connected in parallel with one another, and these transistor dies may be power transistor devices, for example. The semiconductor package 100 may be configured as an integrated power converter circuit such as a half-bridge circuit or full-bridge circuits. In that case, the semiconductor package 100 may comprise at least two transistor dies connected in series with one another. The semiconductor package 100 may comprise other semiconductor dies in addition to transistor devices, such as logic dies, controller dies, driver dies, diodes, etc.

The semiconductor die or dies incorporated into the semiconductor package 100 may have different device configurations. These device configurations include lateral devices that are configured to control a current flowing parallel to a main surface of the die and vertical devices that are configured to control current flowing between a main surface and an opposite facing rear surface of the semiconductor die. Moreover, the die or dies of the semiconductor package 100 may be formed in many different material technologies. For example, the one or more semiconductor dies of the semiconductor package 100 may comprise semiconductor material from group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device assembly, comprising:
a cooling system;
a plurality of semiconductor packages, each comprising a semiconductor die and an encapsulant body; and
a multi-device thermal interface interposed between the plurality of semiconductor packages and the cooling system,
wherein the semiconductor packages are each configured as surface mount devices, and
wherein the multi-device thermal interface thermally couples each of the semiconductor packages to the cooling system,
wherein the cooling system comprises one or more channels that are spaced apart from each of the semiconductor packages by the multi-device thermal interface, and
wherein the cooling system comprises a fluid and is configured to actuate the fluid through the one or more channels and across the plurality of semiconductor packages.

2. The semiconductor device assembly of claim 1, wherein the semiconductor packages are each configured as power devices.

3. The semiconductor device assembly of claim 2, wherein the semiconductor packages are each configured as discrete MOSFETs or discrete IGBTs.

4. The semiconductor device assembly of claim 2, wherein at least one of the semiconductor packages is configured as a power converter.

5. The semiconductor device assembly of claim 1, further comprising a carrier comprising an electrically insulating region and a first structured metallization layer disposed on the electrically insulating region, and wherein the plurality of semiconductor packages is mounted on the carrier.

6. The semiconductor device assembly of claim 5, wherein the semiconductor packages each comprise leads that extend out from outer edge sides of the encapsulant body, and wherein the plurality of semiconductor packages is mounted on the carrier such that the leads of each of the semiconductor packages are affixed and electrically connected to the first structured metallization layer.

7. The semiconductor device assembly of claim 5, wherein the semiconductor packages each comprise a die pad that is exposed from the encapsulant body, and wherein the die pad of each of the semiconductor packages is thermally coupled to the cooling system via the multi-device thermal interface.

8. The semiconductor device assembly of claim 7, wherein the die pad of each of the semiconductor packages faces away from the carrier.

9. The semiconductor device assembly of claim 5, wherein the carrier is a printed circuit board.

10. The semiconductor device assembly of claim 5, wherein the carrier is a power electronics substrate.

11. The semiconductor device assembly of claim 5, wherein the carrier is disposed below the plurality of semiconductor packages, and wherein the multi-device thermal interface and the cooling system are disposed above the carrier.

12. The semiconductor device assembly of claim 1, wherein the semiconductor packages each comprise a die pad that is exposed from the encapsulant body, and wherein the die pad of each of the semiconductor packages is thermally coupled to the cooling system via the multi-device thermal interface.

13. The semiconductor device assembly of claim 12, wherein at least some of the semiconductor packages comprise a thermally conductive structure that is attached to the die pad and thermally couples the die pad of the respective semiconductor package to the multi-device thermal interface.

14. The semiconductor device assembly of claim 1, wherein the multi-device thermal interface comprises gap filler material.

15. The semiconductor device assembly of claim 1, wherein the multi-device thermal interface comprises thermal interface material.

16. The semiconductor device assembly of claim 1, wherein the multi-device thermal interface comprises a layer of thermal interface material and a gap filler material disposed between the semiconductor packages and the layer of thermal interface material.

17. The semiconductor device assembly of claim 1, wherein the multi-device thermal interface comprises metal.

18. The semiconductor device assembly of claim 1, wherein the multi-device thermal interface is configured to electrically isolate each of the semiconductor packages from the cooling system.

\* \* \* \* \*